United States Patent
Ganapathy et al.

(10) Patent No.: US 11,509,333 B2
(45) Date of Patent: Nov. 22, 2022

(54) MASKED FAULT DETECTION FOR RELIABLE LOW VOLTAGE CACHE OPERATION

(71) Applicant: Advanced Micro Devices, Inc., Santa Clara, CA (US)

(72) Inventors: Shrikanth Ganapathy, Santa Clara, CA (US); John Kalamatianos, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/125,145

(22) Filed: Dec. 17, 2020

(65) Prior Publication Data
US 2022/0103191 A1 Mar. 31, 2022

Related U.S. Application Data (60) Provisional application No. 63/083,399, filed on Sep. 25, 2020.

(51) Int. Cl.
*G11C 29/00* (2006.01)
*H03M 13/35* (2006.01)
(Continued)

(52) U.S. Cl.
CPC ....... *H03M 13/353* (2013.01); *G06F 11/1064* (2013.01); *G06F 12/0895* (2013.01); *G06F 2212/1032* (2013.01)

(58) Field of Classification Search
CPC .............. H03M 13/353; G06F 11/1064; G06F 12/0895; G06F 2212/1032
See application file for complete search history.

(56) References Cited

U.S. PATENT DOCUMENTS 10,379,944 B2   8/2019  Kalamatianos et al.
2004/0210814 A1* 10/2004 Cargnoni ............ G06F 11/1064
                                                714/758
(Continued)

OTHER PUBLICATIONS

Ansari, et al., "A Near-threshold 7T SRAM Cell with High Write and Read Margins and Low Write Time for Sub-20Nm FinFET Technologies," Integration, VLSI Journal, vol. 50, No. 06, pp. 91-106, 2015.
(Continued)

*Primary Examiner* — Christine T. Tu
(74) *Attorney, Agent, or Firm* — Kowert Hood Munyon Rankin and Goetzel PC; Rory D. Rankin (57) ABSTRACT

Systems, apparatuses, and methods for implementing masked fault detection for reliable low voltage cache operation are disclosed. A processor includes a cache that can operate at a relatively low voltage level to conserve power. However, at low voltage levels, the cache is more likely to suffer from bit errors. To mitigate the bit errors occurring in cache lines at low voltage levels, the cache employs a strategy to uncover masked faults during runtime accesses to data by actual software applications. For example, on the first read of a given cache line, the data of the given cache line is inverted and written back to the same data array entry. Also, the error correction bits are regenerated for the inverted data. On a second read of the given cache line, if the fault population of the given cache line changes, then the given cache line's error protection level is updated.

20 Claims, 10 Drawing Sheets

(51) Int. Cl.
　　　G06F 12/0895　　(2016.01)
　　　G06F 11/10　　　(2006.01)

(56)　　　　　References Cited

U.S. PATENT DOCUMENTS

| | | | |
|---|---|---|---|
| 2014/0372814 A1* | 12/2014 | Oberlaender | G11C 29/42 714/719 |
| 2016/0173128 A1* | 6/2016 | Ware | G06F 11/1048 714/768 |
| 2017/0147433 A1 | 5/2017 | Shinbashi et al. | |
| 2018/0210669 A1 | 7/2018 | Lee | |
| 2020/0081771 A1 | 3/2020 | Kalamatianos et al. | |
| 2020/0201777 A1 | 6/2020 | Kalamatianos et al. | |

OTHER PUBLICATIONS

Zhang, et al., "ICR: In-Cache Replication for Enhancing Data Cache Reliability", Proceedings of the 2003 International Conference on Dependable Systems and Networks, IEEE Computer Society; 10 pages.
Li, et al., "Soft Error and Energy Consumption Interactions: A Data Cache Perspective", In Proceedings of International Symposium on Low Power Electronics and Design (ISLPED), Aug. 2004, pp. 132-137.
Kim, "Area-Efficient Error Protection for Caches". In Proceedings of the Conference on Design Automation and Test in Europe (DATE), Mar. 2006, 6 pages.
Kulkarni, et al., "A 160 mV Robust Schmitt Trigger Based Subthreshold SRAM", IEEE Journal of Solid-State Circuits, vol. 42, No. 10, Oct. 2007, pp. 2303-2313.
Kim, et al., "Multi-bit Error Tolerant Caches Using Two-Dimensional Error Coding," in Proceedings of the 40th Annual IEEE/ACM International Symposium on Microarchitecture, Washington, 2007, pp. 197-209.
Wang, et al., "A 45nm Dual-Port SRAM with Write and Read Capability Enhancement," in Proceedings of the System on Chip Conference, 2007, pp. 211-214.
Wilkerson, et al., "Trading Off Cache Capacity for Reliability to Enable Low Voltage Operation". In Proceedings of the 35th Annual International Symposium on Computer Architecture (ISCA), Jun. 2008, pp. 203-214.
Chen, et al., "Yield-driven near-threshold SRAM design," in Proceedings of the International Conference on Computer-Aided Design, San Jose, 2007, pp. 1590-1598.
Chishti, et al., "Improving Cache Lifetime Reliability at Ultra Low Voltages". International Symposium on Microarchitecture, Dec. 2009, pp. 89-99.
Abella, et al., "Low vccmin fault-tolerant cache with highly predictable performance". Proceedings of the International Symposium on Microarchitecture Dec. 2010, pp. 111-121.
Dreslinski, et al., "Near-Threshold Computing: Reclaiming Moore's Law Through Energy Efficient Integrated Circuits," Proceedings of the IEEE, Feb. 2010, pp. 253-266.
Zhai, et al., "Energy efficient near-threshold chip multi-processing," in Proceedings of the International Symposium on Low Power Design, New York, 2007, pp. 32-37.
Ghasemi, et al., "Low-voltage on-chip cache architecture using heterogeneous cell sizes for high-performance processors," in Proc. IEEE Int. Symp. High-Performance Computer Architecture, Feb. 2011, pp. 38-49.
Ansari, et al., "Archipelago: A polymorphic cache design for enabling robust near-threshold operation". Proceedings of the International Symposium on High Performance Computer Architecture (HPCA), Feb. 2011, pp. 539-550.
Alameldeen, et al., "Energy-Efficient Cache Design Using Variable Strength Error-Correcting Codes," in Proceedings of the International Symposium on Computer Architecture, New York, 2011, pp. 461-471.
Zhang, et al., "Reliable Ultra Low Power Cache Design for Many-Core Systems", IEEE Transactions on Circuits and Systems II, Express Briefs, v59, n12, Dec. 2012, pp. 858-862.
Qureshi, et al., "Operating SECDED-Based Caches at Ultra-Low Voltage with FLAIR", Proceedings of DSN Conference, 2013, 11 pages.
Bhavnagarwala, et al., "A 400mV Active VMIN, 200mV Retention VMIN, 2.8 GHz 64Kb SRAM with a 0.09 um2 6T bitcell in a 16nm FinFET CMOS Process", IEEE Symposium on VLSI Circuits, 2016, 2 pages.
Ganapathy, et al., "Killi: Runtime Fault Classification to Deploy Low Voltage Caches without MBIST", HPCA 2019, pp. 304-316.
Sadler, et al., "Choosing an Error Protection Scheme for a Microprocessor's L1 Data Cache". In Proceedings of International Conference on Computer Design (ICCD), Oct. 2006, pp. 1-7.
Yoon, et al., "Memory Mapped ECC: Low-Cost Error Protection for Last Level Caches", Proceedings of ISCA, Jun. 2009, 12 pages.
Ganapathy, et al., "On Characterizing Near-Threshold SRAM Failures in FinFet Technology", DAC 2017 (Abstract).
Alameldeen, et.al., "Frequent Pattern Compression: A significance-based compression scheme for L2 caches", TR1500 CS Dept, Univ of Wisconsin, Madison 2004.
Pekhimenko et.al., "Base-Delta Immediate Compression: Practical data compression for on-chip caches", PACT 2012.
International Search Report and Written Opinion in International Application No. PCT/US2021/043028, dated Jan. 3, 2022, 10 pages.

* cited by examiner

| Tag | Metadata | Error Protection Level | Inverted | First Read? | # of Bit Errors in Original Data |
|---|---|---|---|---|---|
| 502 | 504 | 506 | 508 | 510 | 512 |

Tag Array Entry 500

MASKED FAULT DETECTION FOR RELIABLE LOW VOLTAGE CACHE OPERATION

CROSS REFERENCE TO RELATED APPLICATIONS

This application claims priority to Provisional Patent Application Ser. No. 63/083,399, entitled "MASKED FAULT DETECTION FOR RELIABLE LOW VOLTAGE CACHE OPERATION", filed Sep. 25, 2020, the entirety of which is incorporated herein by reference.

GOVERNMENT LICENSE RIGHTS

This invention was made with Government support under the PathForward Project with Lawrence Livermore National Security, Prime Contract No. DE-AC52-07NA27344, Subcontract No. B620717 awarded by the United States Department of Energy. The United States Government has certain rights in this invention.

BACKGROUND

Description of the Related Art

Most modern computing devices provide at least one level of cache memory (or "cache") in addition to a main memory in the computing device. Generally, caches are smaller-capacity, faster-access memories that are used for storing a limited number of copies of data and instructions to be used for performing various operations (e.g., computational operations) nearer to the functional blocks in the computing device that perform the operations. Caches are typically implemented using higher-speed memory circuits, such as static random access memory (SRAM) integrated circuits and other types of memory circuits.

Generally, a cache may store multiple blocks, each of which is a copy of data stored at a corresponding address in the system memory. As used herein, a "cache line" or "cache block" is a set of bytes stored in contiguous memory locations, which are treated as a unit for coherency purposes. In some implementations, a cache line can also be the unit of allocation and deallocation in a cache. The number of bytes in a cache line varies according to design choice.

During operation, the memory circuits in a cache can consume a significant portion of the overall electrical power consumed by a computing device. Because power consumption is an important concern for computing devices, designers have proposed various techniques for reducing power consumption by the memory circuits in caches. For example, designers have suggested reducing the supply voltage for the memory circuits, which can lead to a noticeable reduction in the power consumption of the memory circuits. Unfortunately, reducing the supply voltage causes the memory circuits to become more susceptible to bit errors because reductions in supply voltage are associated with reduced noise margins for the individual memory elements in the memory circuits. In other words, the memory elements in the memory circuits are more susceptible to faults arising from process variation with lower supply voltages. Also, there can be failures in the peripheral circuits of the memory that can cause failures under low voltage operation.

Generally, bit errors occur when accesses to memory elements in the cache return values which were not stored in those elements. For example, if a "0" value is stored in a memory element, a bit error occurs when a "1" value is returned when reading the memory element. Alternatively, if a "1" value is stored in a given element, a bit error occurs when a "0" value is returned when reading the given element. However, if a "0" value is stored in this defective element, and a "0" is returned upon reading the element, this gives the impression to the cache controller that the defective element is actually functioning properly. Only when a "1" is stored in this defective element, will the fault be discovered. This scenario is referred to as a "logical masked fault". In other words, a "logical masked fault" is defined as the event where a memory element stores a value which hides the unreliability of the memory element. "Logical masked faults" can also be referred to herein as "masked faults". Masked faults can cause a cache controller to incorrectly assess the reliability or stability of cache lines.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Systems, apparatuses, and methods for implementing masked fault detection for reliable low voltage cache operation are disclosed herein. In one implementation, a system includes one or more levels of cache with memory configured to store data (e.g., cache lines and/or corresponding tags). In various implementations, the cache includes entries configured to store data (e.g., a cache line), entries configured to store a tag associated with stored data, and a cache controller. In some embodiments, the cache stores data in a data array and tags in a tag array. In some implementations, the data and tag arrays are separate structures and in others they are combined in a single structure. These and other embodiments are contemplated for storing data. A given data array includes a plurality of data entries for storing a plurality of cache lines and a given tag array includes a plurality of tag entries corresponding to the plurality of cache lines. In one implementation, the cache operates at a relatively low voltage level to conserve power. However, at low voltage levels, the cache is more likely to suffer from bit errors. It is noted that bit errors can occur for other reasons besides operating at a low voltage level, and the techniques described herein can discover and remedy bit errors in those scenarios.

To mitigate the bit errors occurring in cache lines, the cache employs a strategy to uncover masked faults during runtime accesses to data by actual software applications executing on a processor. In order to implement this strategy, the cache controller inverts data of a given cache line and writes inverted data back to the given cache line in response to detecting a first read of the given cache line after a fill. The given cache line is representative of any cache line in the cache. It is noted that the cache controller does not invert data of the given cache line when the data of the given cache line is read out of the cache during an eviction. The data inversion occurs in response to an actual software application executing on the processor reading the data out of the cache. Next, the cache controller tags the given cache line Next, the cache controller marks the given cache line as storing inverted data. Then, the cache controller regenerates error correction bits for the inverted data and overwrites original error correction bits for the given cache line with regenerated error correction bits. If a fault population of the cache line changes after a second read of the given cache line, the cache controller changes an error protection level used for protecting the given cache line. This helps to adapt the error protection scheme appropriately based on masked faults.

In one implementation, each tag entry includes an indicator of whether a corresponding data entry includes inverted or non-inverted data. In one implementation, the cache controller retrieves historical data for the given cache line, with the historical data including an indication of a first number of bit errors detected during a first read of the given cache line. Also, the cache controller determines a second number of bit errors for the given cache line in response to a processor performing a second read of the given cache line, where the second number of bit errors is determined by reading the regenerated error correction bits. After the second read, the cache controller compares the second number of bit errors to the first number of bit errors. If the second number of bit errors is greater than the first number of bit errors, the cache controller increases the error protection level used for protecting the given cache line.

Figure 1:
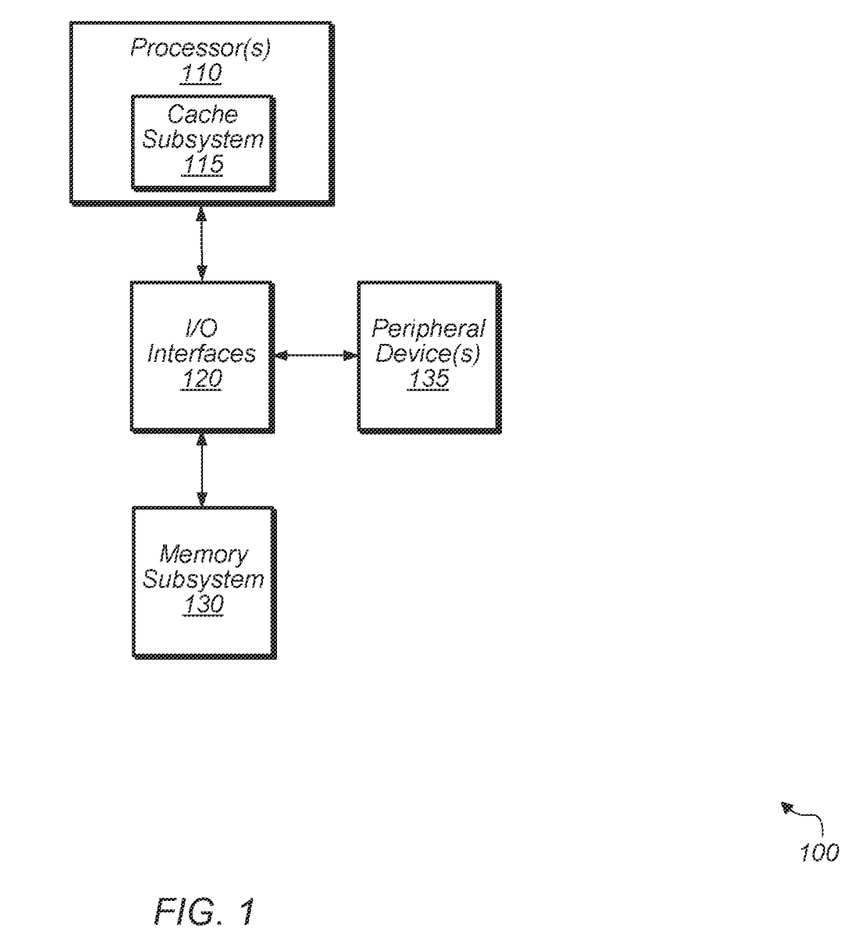
FIG. 1 is a block diagram of one implementation of a computing system.

Referring now to FIG. 1, a block diagram of one implementation of a computing system 100 is shown. In one implementation, computing system 100 includes at least processor(s) 110, input/output (I/O) interfaces 120, memory subsystem 130, and peripheral device(s) 135. In other implementations, computing system 100 can include other components, computing system 100 can omit an illustrated component, and/or computing system 100 can be arranged differently. In one implementation, each processor 110 includes a cache subsystem 115. Cache subsystem 115 has any number of cache levels with any of various types of caches which can vary according to the implementation. In some cases, one or more caches in the cache hierarchy of cache subsystem 115 can be located in other locations external to processor(s) 110. In one implementation, one or more caches of cache subsystem 115 employ schemes to uncover masked faults during live accesses to data by actual software applications. More details on these schemes will be provided throughout the remainder of this disclosure.

Processors(s) 110 are representative of any number and type of processing units (e.g., central processing unit (CPU), graphics processing unit (GPU), digital signal processor (DSP), field programmable gate array (FPGA), application specific integrated circuit (ASIC)). Memory subsystem 130 includes any number and type of memory devices. For example, the type of memory in the memory devices of memory subsystem 130 can include high-bandwidth memory (HBM), non-volatile memory (NVM), Dynamic Random Access Memory (DRAM), Static Random Access Memory (SRAM), NAND Flash memory, NOR flash memory, Ferroelectric Random Access Memory (FeRAM), or others. I/O interfaces 120 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral device(s) 135 can be coupled to I/O interfaces 120. Such peripheral device(s) 135 include (but are not limited to) displays, keyboards, mice, printers, scanners, joysticks or other types of game controllers, media recording devices, external storage devices, network interface cards, and so forth.

In various implementations, computing system 100 is a computer, laptop, mobile device, game console, server, streaming device, wearable device, or any of various other types of computing systems or devices. It is noted that the number of components of computing system 100 varies from implementation to implementation. For example, in other implementations, there are more or fewer of each component than the number shown in FIG. 1. It is also noted that in other implementations, computing system 100 includes other components not shown in FIG. 1. Additionally, in other implementations, computing system 100 is structured in other ways than shown in FIG. 1.

Figure 2:
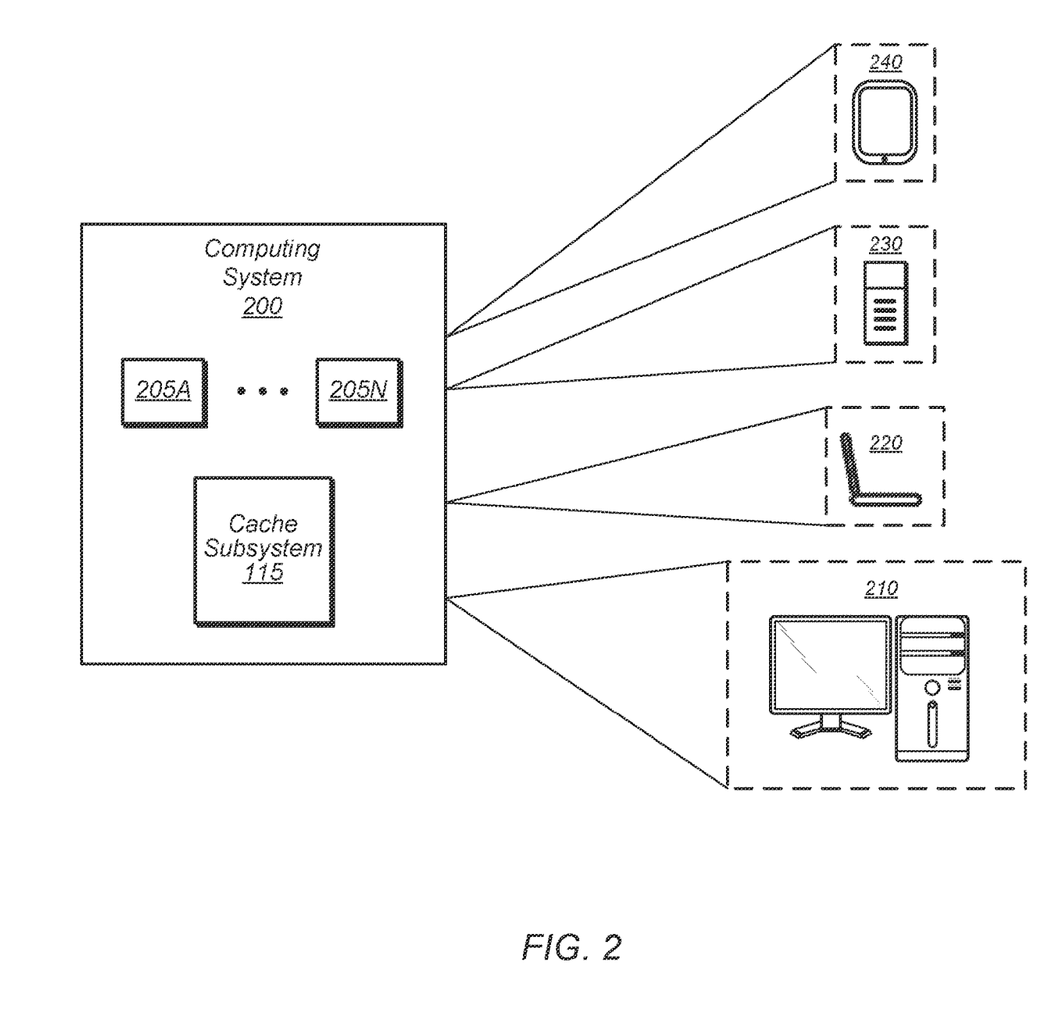
FIG. 2 is a block diagram of one implementation of a computing system.

Turning now to FIG. 2, a block diagram of one implementation of a computing system 200 is shown. As shown, system 200 represents chip, circuitry, components, etc., of a desktop computer 210, laptop computer 220, server 230, mobile device 240, or otherwise. Other devices are possible and are contemplated. In the illustrated implementation, the system 200 includes multiple components 205A-N and at least one instance of cache subsystem 115 (of FIG. 1). Components 205A-N are representative of any number and type of components, such as one or more processors, one or more memory devices, one or more peripheral devices, and so on. Cache subsystem 115 includes any number of cache levels which include mechanisms for uncovering masked faults during runtime accesses to data by actual software applications. More details regarding these mechanisms and corresponding methods will be provided throughout the remainder of this disclosure.

Figure 3:
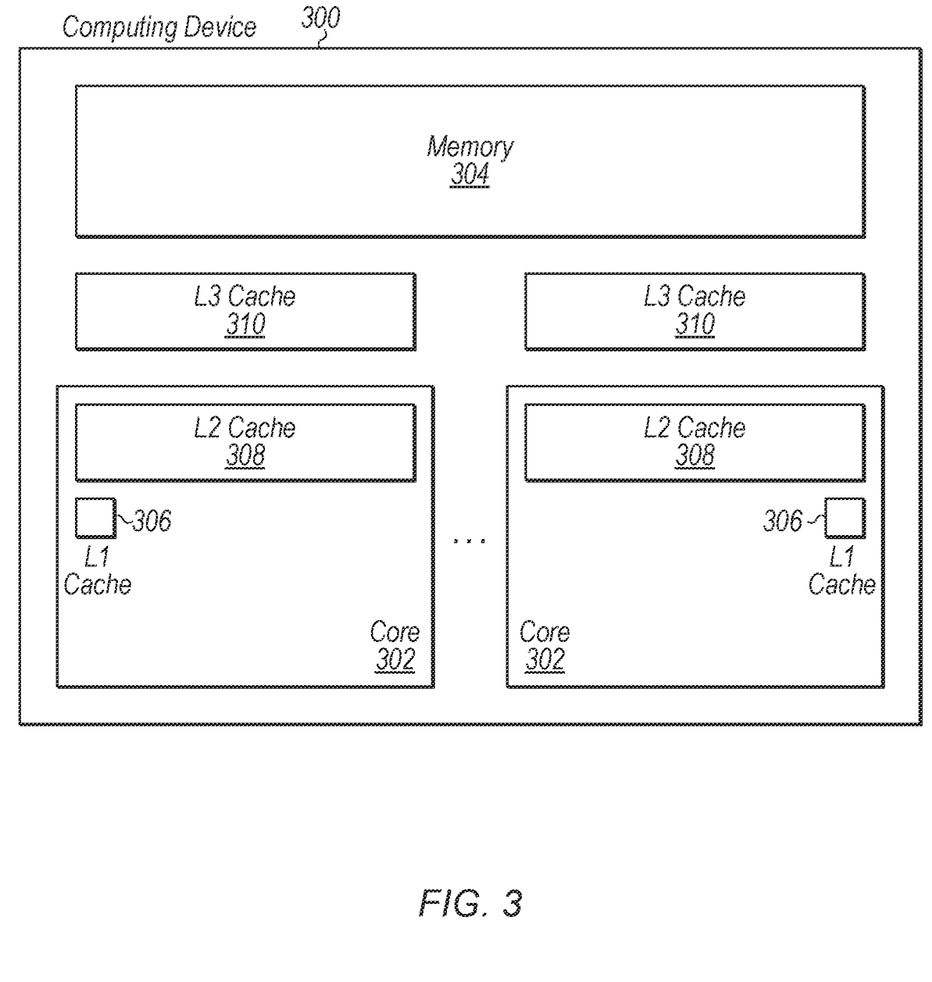
FIG. 3 is a block diagram of one implementation of a computing system.

Referring now to FIG. 3, a block diagram illustrating a computing device 300 in accordance with some implementations is shown. As can be seen in FIG. 3, computing device 300 includes two cores 302. Each core 302 is a functional block including one or more computational/processing mechanisms such as central processing units (CPUs), graphics processing units (GPUs), embedded processors, application specific integrated circuits (ASICs), and/or other computational mechanisms that perform computational and/or processing operations in computing device 300.

Computing device 300 includes memory 304. Memory 304 is the "main memory" of computing device 300, and includes memory circuits such as one or more of dynamic random access memory (DRAM), double data rate synchronous DRAM (DDR SDRAM), non-volatile random access memory (NVRAM), and/or other types of memory circuits for storing data and instructions for use by functional blocks in computing device 300, as well as control circuits for handling accesses of the data and instructions that are stored in the memory circuits.

Computing device 300 includes a hierarchy of cache memories (or "caches") that includes a level one (L1) cache 306, level two (L2) cache 308, and level three (L3) cache 310 for each core 302. Each of the L1 cache 306, L2 cache 308, and L3 cache 310 include memory circuits such as static random access memory (SRAM) memory circuits that are used for storing copies of data and instructions, as well as control circuits for handling accesses of the memory circuits. Proceeding in the order L1 cache 306, L2 cache 308, and L3 cache 310, each cache is larger in capacity and is physically located farther from the computational mechanisms that use the data and instructions stored therein and is therefore slower to access. In some implementations, some or all of the caches in the hierarchy of caches are configured as write-through caches. In these implementations, when modified data is written from a core to a write-through cache, the data is immediately written to a next-lower cache in the hierarchy and/or into memory 304. In this way, a correct and current copy of the data in the write though cache is held in a next-lower cache and/or in memory 304.

Although implementations are described with a particular arrangement of cores 302, some implementations include a different number and/or arrangement of cores, as shown by the ellipsis in FIG. 3. For example, some implementations have only one core, while other implementations have five, eight, or another number of cores. Generally, the described implementations can use any arrangement of cores that can perform the operations herein described.

Although implementations are described with a particular arrangement of caches, some implementations include a different number and/or arrangement of caches. For example, some or all of the caches (e.g., L1 cache 306) may be implemented as separate instruction and data caches. As another example, some implementations include different levels of caches, from only one level of cache to multiple levels of caches, and some or all of these caches may be located in a core 302 and/or external to the core 302. Generally, the described implementations can use any arrangement of caches that can perform the operations herein described.

Although computing device 300 is simplified for illustrative purposes, in some implementations, computing device 300 includes additional or different elements and mechanisms for performing the operations herein described and other operations. For example, computing device 300 can include power subsystems, media processing subsystems, input-output subsystems, communication subsystems, networking sub systems, display subsystems, etc.

Computing device 300 can be, or can be included in, any electronic device that performs computational operations. For example, computing device 300 can be, or can be included in, electronic devices such as desktop computers, laptop computers, wearable computing devices, tablet computers, virtual or augmented reality equipment, smart phones, servers, network appliances, toys, audio-visual equipment, home appliances, controllers, vehicles, etc., and/or combinations thereof.

Figure 4:
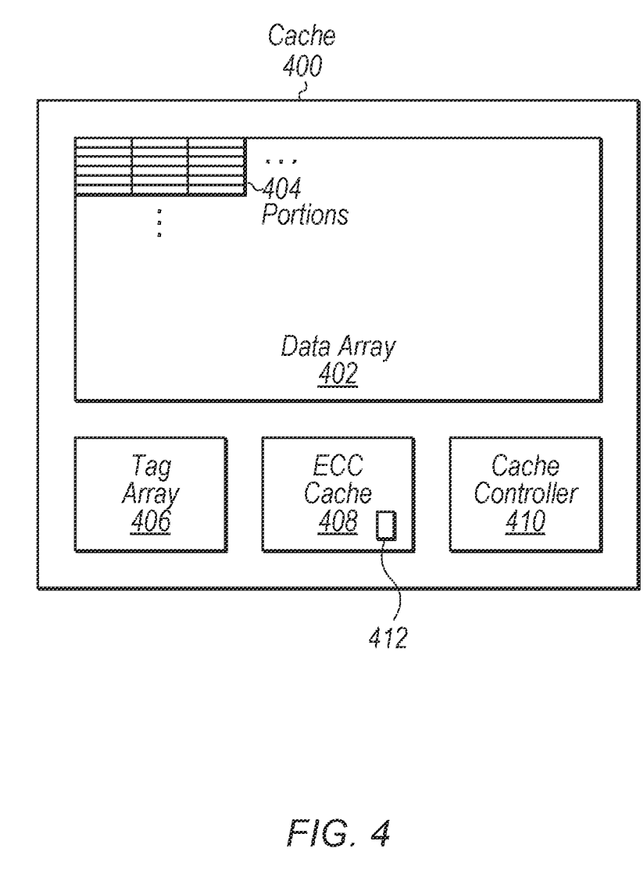
FIG. 4 is a block diagram of one implementation of a cache.

Turning now to FIG. 4, a block diagram illustrating a cache 400 in accordance with some implementations is shown. In some implementations, some or all of L1 cache 306, L2 cache 308, and L3 cache 310 (of FIG. 3) include the functional blocks shown in cache 400. As can be seen in FIG. 4, cache 400 includes data array 402, tag array 406, error correction code (ECC) cache 408, and cache controller 410. Data array 402 is a functional block that includes memory circuits (e.g., SRAM or other types of memory circuits) that are used for storing data in cache 400 (i.e., for storing data and/or instructions). Data array 402 includes any number of portions 404 (only some of which are shown in FIG. 4), each portion 404 including a subset of the memory circuits for storing data for a single cache line (where a cache line is N bytes, N being 64, 128, or another value). In some implementations, each portion 404 also includes or is associated with information such as metadata (e.g., valid bits, accessed bits, permission bits).

In some implementations, along with data, data array 402 (e.g., some or all of the portions 404) is used for storing parity information. Generally, a given piece of parity information includes extra information (e.g., one or more bits) that is used to detect bit errors in a corresponding data entry in data array 402. For example, in some implementations, segmented and interleaved parity is used. For segmented and interleaved parity, data is logically divided into a number of overlapping segments (e.g., four) and parity information is generated for each segment. Using segmented and interleaved parity, multi-bit bit errors can be detected in the data. In other implementations, the parity information can be stored in other locations other than data array 402.

Tag array 406 is a functional block that includes memory circuits that are logically divided into a number of entries, with each entry storing address (or "tag") information that uniquely identifies data stored in a corresponding portion of data array 402, along with a corresponding history record. As data is stored in portions 404 of data array 402, corresponding entries in tag array 406 are updated with address information based on or derived from the addresses for the data. The address information in entries in tag array 406 is then used to determine, based on addresses for subsequently requested data, whether the requested data is present in data array 402.

Error correction code (ECC) cache 408 is a functional block that includes memory circuits that are logically divided into a number of entries, each entry configured to store the checkbits generated by an error correction code. Checkbits are used to detect and/or correct bit errors in data stored in portions 404 of data array 402. For example, in some implementations, the error correction codes are single-error correcting, double-error detecting (SEC-DED) codes. Using a SEC-DED code, single-bit errors can be corrected and two-bit errors can be detected in corresponding data. Other error correction codes include double-error correcting, triple error detecting (DEC-TED) codes, triple-error correcting, quadruple error detecting (TEC-QED) codes, and so on. It should be understood that other types of error detection codes or error correction codes can be used other than those listed here. In some implementations, ECC cache 408 includes a data array with a number of entries for storing checkbits and a tag array for storing corresponding address information. In these implementations, the tag array in error correction code cache 408 can be used to search for checkbits for particular addresses in a similar way to how tag array 406 is used to search for data in portions 404 of data array 402.

In some implementations, ECC cache 408 includes a smaller number of entries than there are portions 404 in data array 402. For example, ECC cache 408 may have a number of entries that is 20% of the number of portions in data array 402. In this case, if there were 500 portions in data array 402, there would be 100 entries in error correction code cache 408. In some of these implementations, the entries in ECC cache 408 are not permanently mapped to particular portions 404 of data array 402. Instead, each entry is configurably mapped to any of various portions 404 of data array 402. For example, in one implementation, each entry in ECC cache 408 is mapped to a single corresponding portion 404 in data array 402 that has been detected to have a single-bit error.

In some implementations, the configurable mapping of the entries in ECC cache 408 is dynamically updated or changed (i.e., updated at runtime as cache 400 operates). For example, when a transient single-bit error is detected in a portion 404 (e.g., due to a soft error such as a cosmic ray fault), an entry in ECC cache 408 may be assigned or allocated to hold checkbits for the portion. When the single-bit error is subsequently confirmed to no longer be present and the checkbits are thus no longer needed for the portion 404, the entry in ECC cache 408 may be unassigned, invalidated, etc. The entry can then be assigned to another portion 404 in data array 402 as needed.

In one implementation, ECC cache 408 stores history records 412 which are representative of any number and type of historical data records associated with detected errors in portions 404 of data array 402. History records 412 store a representation of a number of bit errors detected in the corresponding portions 404. For example, in some implementations, each history record 412 is a two-bit value for each corresponding portion 404. In these implementations, a value of 00 indicates that no bit error was/has been detected in the corresponding portion 404, a value of 01 indicates that a single-bit bit error was/has been detected, and a value of 11 indicates that a multi-bit bit error was/has been detected. Other implementations can have other numbers of bits per corresponding portion 404. Depending on the implementation, history records 412 can include entries for only a subset of portions 404 or history records 412 can include entries for the entirety of portions 404. In one implementation, history records 412 are used to determine an error protection level for the corresponding portion 404 or whether the corresponding portion 404 is to be disabled. History records 412 are also used to determine operations to be performed when servicing load and store requests to the portions of the cache.

Cache controller 410 is a functional block that performs various functions for controlling operations in cache 400. For example, cache controller 410 manages storing data to, invalidating data in, and evicting data from data array 402. Cache controller 410 also performs lookups for data in tag array 406, handles coherency operations for cache 400, and/or responds to requests for data from cache 400. In some implementations, cache controller 410 performs at least some of the operations for selecting an error protection level for portions 404 based on a total number of detected errors as herein described. Although cache 400 shown in FIG. 4 is simplified for illustrative purposes, in some implementations, cache 400 includes a different arrangement of functional blocks. Generally, cache 400 includes sufficient functional blocks to perform the operations herein described and other operations performed by caches.

In some implementations, one or more mechanisms are employed for adjusting a supply voltage provided to cache 400. For example, in some implementations, the supply voltage for the memory circuits may be lowered to reduce the amount of electrical power consumed by the memory circuits in cache 400. In some of these implementations, it is possible to lower the supply voltage low enough to cause low-voltage faults, i.e., to cause the memory circuits to output unexpected or undesired values due to the reduced noise margin caused by the lowered supply voltage. Such faults can be permanent at a given supply voltage-frequency combination. To avoid using erroneous data, error protection levels are adjusted for portions of the cache 400 based on the detection of all errors including those masked under the stored data values. Also, portions of the cache 400 can be disabled for which error protection is ineffectual.

The mechanisms and operations herein described are not limited to protecting against low-voltage faults. Other faults that affect accesses to memory elements in a data array in a cache, such as failed circuit elements, process variation faults, thermal faults, aging-related faults, or other issues that cause the memory elements to experience permanent or repeated faults given particular operating conditions, can be mitigated using the mechanisms and operations herein described.

Figure 5:
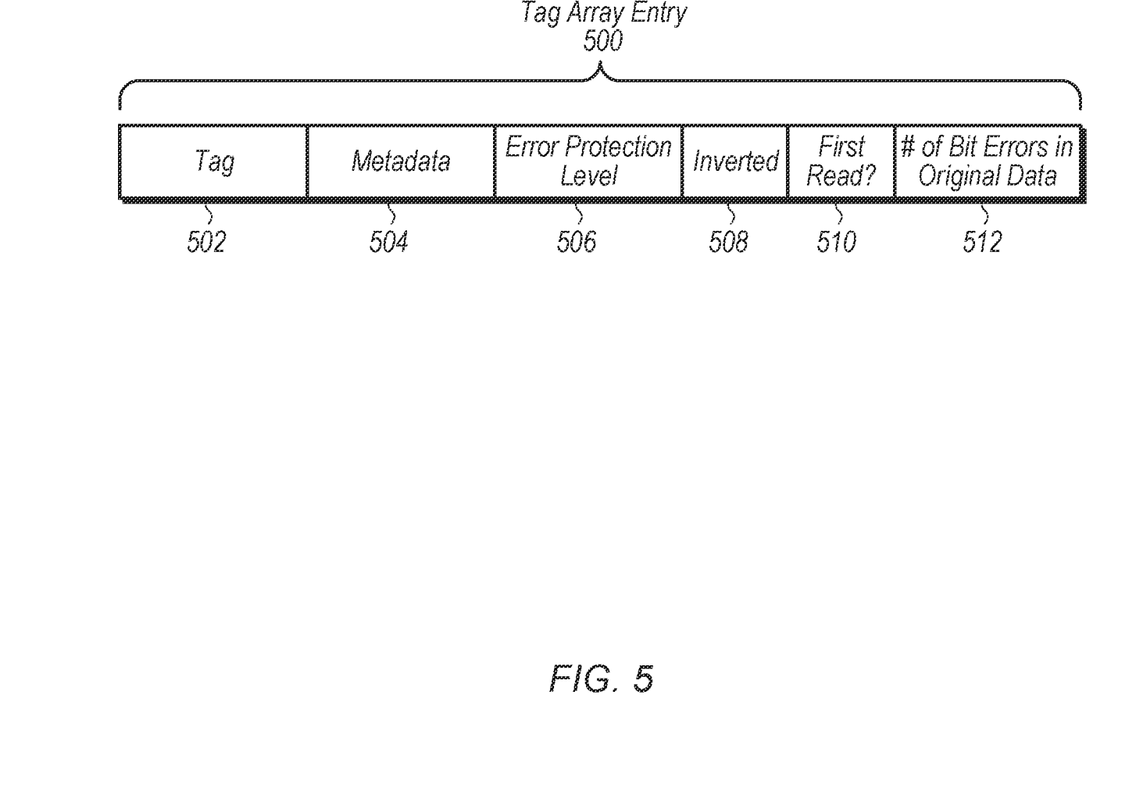
FIG. 5 illustrates a tag entry in accordance with one implementation.

Referring now to FIG. 5, a tag entry 500 in accordance with one implementation is shown. Depending on the implementation, tag entry 500 includes a plurality of different fields for use in a cache capable of operating at a low supply voltage. These fields can be stored in a tag array (e.g., tag array 406 of FIG. 4) or in other locations within the cache. In one implementation, tag field 502 includes the tag portion of the address of the corresponding cache line. Depending on the implementation, metadata field 504 includes a valid bit, permissions, attributes, and/or other information associated with the corresponding cache line.

In one implementation, inverted field 508 includes an indication specifying whether the data of the cache line is stored in an inverted state. The cache controller queries inverted field 508 to determine whether to invert the data retrieved from the cache line for an access to the cache line. First read field 510 includes an indication specifying whether a read has been performed for the cache line since the fill. The cache controller clears first read field 510 on a fill, and first read field 510 gets set after the first read. Alternatively, in another implementation, inverted field 508 serves as an indication of whether the first read has occurred. In this implementation, if inverted field 508 is a first value (e.g., 0), this means the data is not inverted, and the first read has not occurred. If inverted field 508 is a second value (e.g., 1), this means the data is inverted, and that the first read has occurred. In this implementation, first read field 510 can be omitted from tag array entry 500.

When a cache line is read for the first time after a fill, the cache controller inverts the data and then writes the inverted data back to the entry in the data array. The cache controller also calculates the number of bit errors for the cache line (following the first read of the cache line) based on the checkbits stored for the cache line. In one embodiment, the cache controller then stores the number of bit errors in bit error field 512. In another embodiment, the number of bit errors can be inferred by the selected error protection level field 506 and does not need to be stored in field 512.

On a second read of the cache line, the inverted data will be read from the data array. The cache controller will determine the number of errors in the inverted data by using the checkbits which were generated for the inverted data. In one embodiment, the total number of bit errors in the cache line is equal to the sum of bit errors on the inverted data and original data in field 512. If the number of bit errors in the inverted data is non-zero, then the cache controller has uncovered one or more masked faults, and the cache controller conservatively increases the error protection scheme used for protecting the cache line. In some cases, the cache controller can mark the cache line as unusable or as disabled if the total number of bit errors is greater than a threshold. Also, in some implementations, the cache controller can perform these steps and store different error information for multiple different frequency/voltage combinations used for operating the cache.

Figure 6:
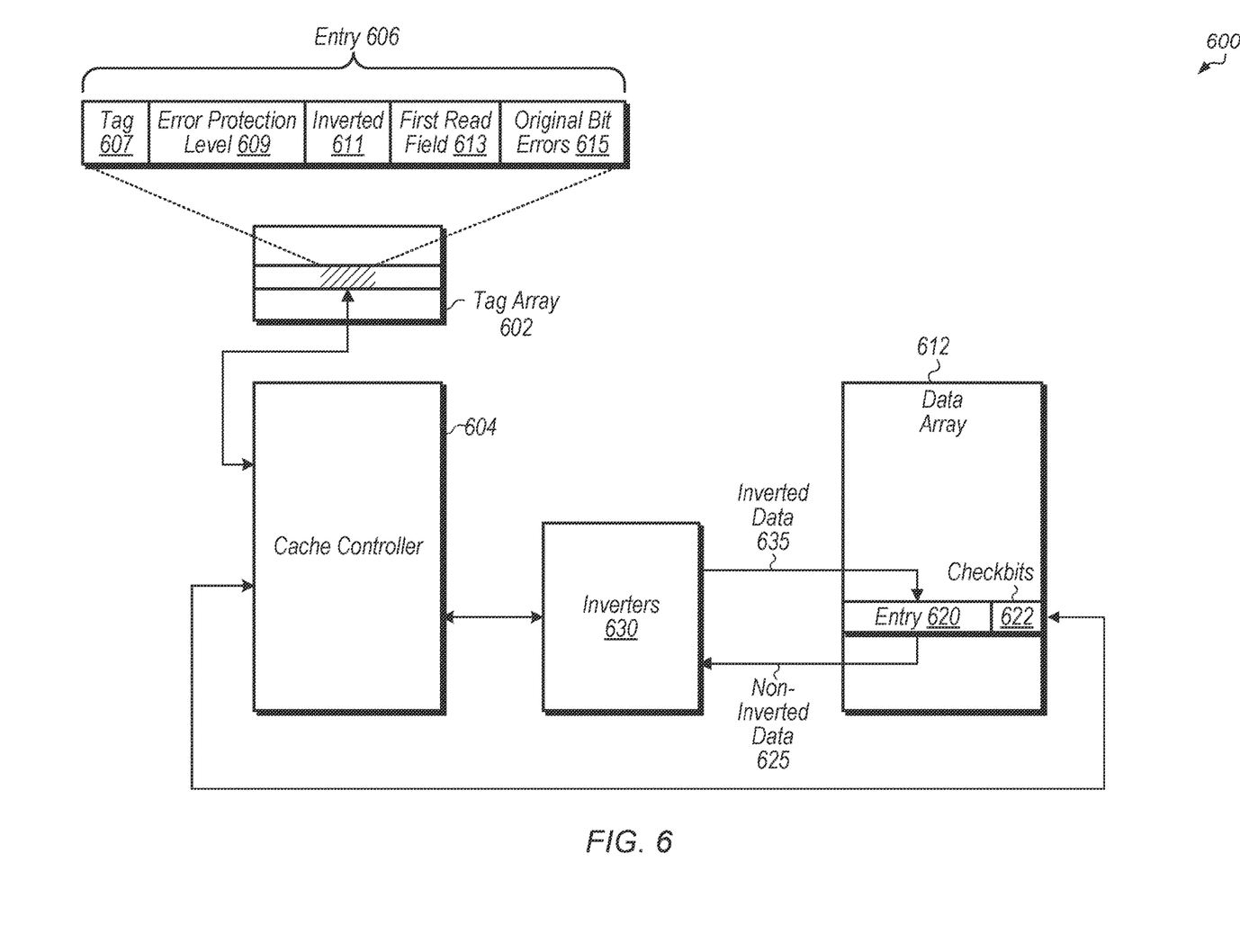
FIG. 6 is a block diagram of one implementation of a cache processing a first read to a cache line after a fill.

Turning now to FIG. 6, a block diagram of one implementation of a cache 600 processing a first read to a cache line after a fill is shown. In one implementation, cache controller 604 accesses tag array 602 to locate a matching entry when receiving a read request for a given memory address. If the lookup to tag array 602 results in a hit, cache controller 604 retrieves the matching entry from tag array 602. It is assumed for the purposes of this discussion that the lookup to tag array 602 matches with tag 607 of entry 606. It will also be assumed that this is the first read to the given memory address since the data of the given memory address was allocated in cache 600. In one implementation, field 613 in the matching entry of tag array 602 provides an indication to cache controller 604 that this is the first read of the cache line since the fill by the processor executing a real application.

In response to detecting the hit to entry 606, cache controller 604 also retrieves error protection level 609 from entry 606. Error protection level 609 specifies the level of error protection (e.g., SEC-DED, DEC-TED) that is currently being used to protect the data array entry 620 corresponding to tag array entry 606. Also in response to detecting the hit to entry 606, cache controller 604 retrieves the data from the corresponding entry 620 in data array 612 and cache controller 604 retrieves the checkbits 622. While checkbits 622 can be stored in the same data array entry 620 as the cache line data in one implementation, the checkbits 622 can be stored in other locations in other implementations. It should be understood that the illustration of checkbits 622 being part of the entry 620 in data array 612 is merely representative of one implementation and does not preclude storing the checkbits 622 in other locations (e.g., a dedicated ECC array). Cache controller 604 uses the checkbits 622 to calculate the number of bit errors in the retrieved data from the entry 620 in data array 612. In one implementation, cache controller 604 stores an indication of the number of bit errors in original bit errors field 615 of entry 606 of tag array 602. Any type of encoding can be used to encode the indication of the number of bit errors in field 615 of the tag entry 606.

Also, inverters 630 invert the non-inverted data 625 retrieved from the data array entry 620 to create inverted data 635. Then inverted data 635 is written back to the same data array entry 620, and inverted field 611 and first read field 613 are set indicating that the first read (by a processor) has been performed to entry 620. By setting inverted field 611, this indicates that entry 620 stores inverted data 635. It is noted that if there any correctible errors in non-inverted data 625, these errors can be corrected prior to generating inverted data 635 and an error handler can log the correctable errors. If there are any non-correctible errors, then the error handler can be invoked. Any type of error handler can be used, with the type of error handler varying from implementation to implementation. Also, checkbits are regenerated based on inverted data 635, and these regenerated ECC bits are written back over the original checkbits 622.

On a second read to the given memory address, entry 620 is accessed and the inverted data 635 and regenerated checkbits 622 are retrieved. Cache controller 604 uses the regenerated checkbits 622 to determine how many errors are included in the retrieved inverted data 635. Also, cache controller corrects any correctible errors in inverted data 635, and then inverters 630 invert the data back to its original state. The data in its original state is then provided to the requestor (e.g., a processor core). In one implementation, the data in its original state is written back to entry 620, checkbits 622 are regenerated, and inverted field 611 is cleared to indicate the data is stored in its non-inverted state. If the number of errors in the inverted data 635 is non-zero, then cache controller 604 increases the error protection level used to protect entry 620. For example, if the previous error protection level used a SEC-DED code, the new error protection level can use a DEC-TED code if the number of errors in the inverted data 635 is one. When cache controller 604 increases the error protection level used to protect entry 620, cache controller 604 updates error protection level field 609 to record an indication of this increased level of protection.

Figure 7:
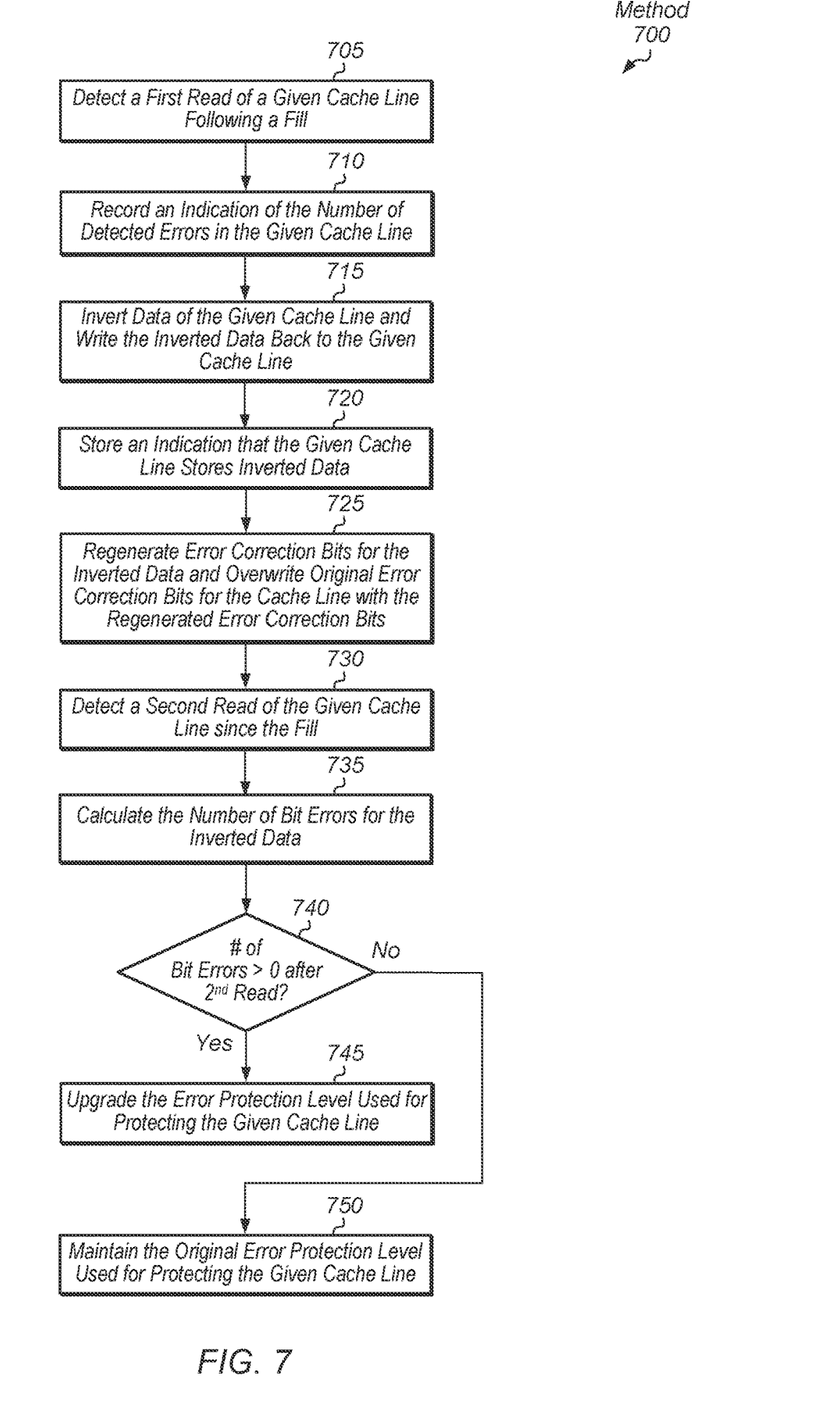
FIG. 7 is a generalized flow diagram illustrating one implementation of a method for employing masked fault detection for reliable low voltage cache operation.
Figure 8:
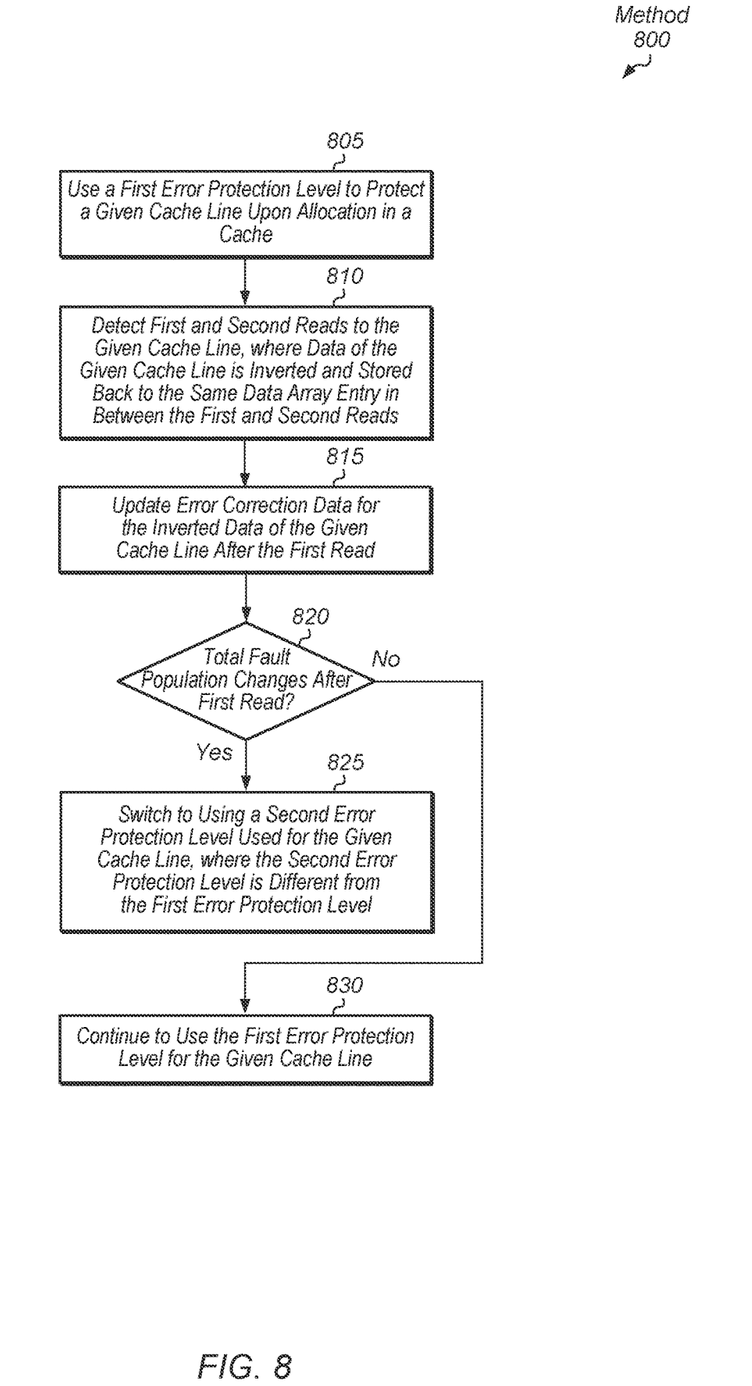
FIG. 8 is a generalized flow diagram illustrating one implementation of a method for adjusting cache line error protection levels.
Figure 9:
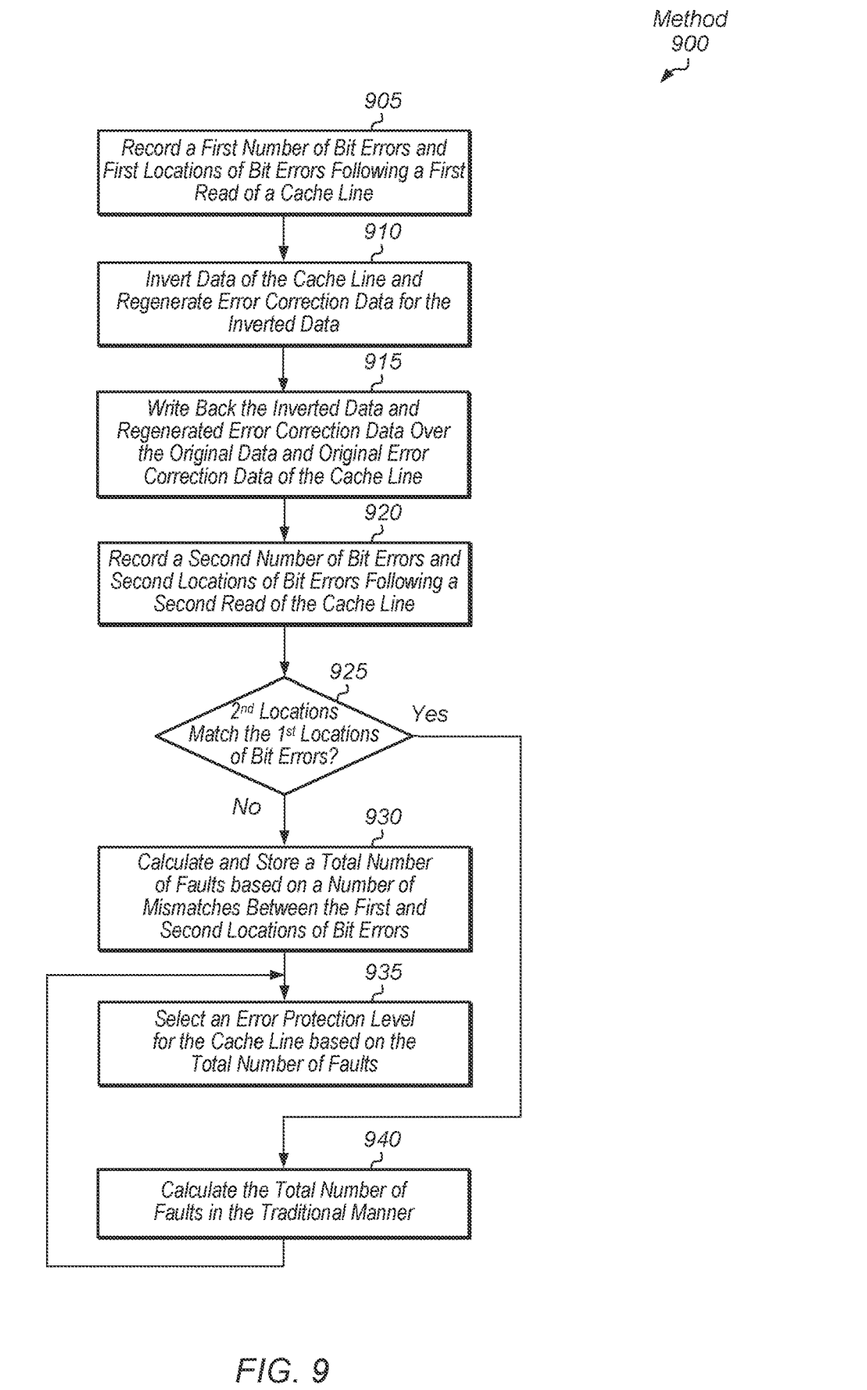
FIG. 9 is a generalized flow diagram illustrating one implementation of a method for tracking masked faults in cache lines.

Referring now to FIG. 7, one implementation of a method 700 for employing masked fault detection for reliable low voltage cache operation is shown. For purposes of discussion, the steps in this implementation and those of FIG. 8-9 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 700.

A cache controller detects a first read of a given cache line following a fill (block 705). As used herein, the term "first read" is defined as the first time a read request targeting the address of the given cache line is received by the cache controller after the given cache line is allocated in the cache. It is assumed for the purposes of this discussion that the read request is generated by a processor executing an actual user software application. In response to detecting the first read of the given cache line, the cache controller records an indication of the number of detected errors in the given cache line (block 710). Also in response to detecting the first read of the given cache line, the cache controller inverts data of the given cache line and writes the inverted data back to the given cache line (block 715). Next, the cache controller stores an indication that the given cache line stores inverted data (block 720). Then, the cache controller regenerates error correction bits for the inverted data and overwrites original error correction bits for the cache line with the regenerated error correction bits (block 725).

At a later point in time, the cache controller detects a second read of the given cache line since the fill (block 730). In response to detecting the second read of the given cache line, the cache controller calculates the number of bit errors in the inverted data (block 735). If the number of bit errors on the inverted data is greater than zero after the second read of the given cache line (conditional block 740, "yes" leg), then the cache controller upgrades the error protection level used for protecting the given cache line (block 745). Otherwise, if the bit error count for the inverted data is zero after the second read of the given cache line (conditional block 740, "no" leg), then the cache controller maintains the original error protection level for protecting the given cache line (block 750). After blocks 745 and 750, method 700 ends.

In another embodiment, the total number of bit errors in the cache line is estimated using the relative position of the errors within the cache line. In the above scenario, if the same cache storage cell fails for both the non-inverted state and the inverted-state, then it is counted twice and may result in conservatively marking the line as having two distinct faults. To improve upon this method, in one implementation, the non-inverted state syndrome, generated by the ECC logic, is stored in the ECC cache 408 or in the data array 612 when the non-inverted data is stored to the cache data array for the first time. In step 735, the syndrome of the inverted data is generated and in step 740, an XOR operation is performed between the syndrome of the non-inverted state and the syndrome of the inverted state. If the XOR results in a Zero, then this means that all faults in both the inverted state and non-inverted state occurred in the same bit positions and therefore it is assumed that the number of errors did not change with the inverted data and the error protection level can remain the same. This corresponds to the "No" leg from conditional block 740 to block 750. However, for a non-zero outcome for the XOR operation between the syndromes of the non-inverted state and the inverted state, this means that some or all of the faults in the inverted data occur at different positions from the faults in the non-inverted data. Therefore the line will be marked as having a number of additional faults equal to the number of errors detected on inverted data (corresponding to the "Yes" leg from conditional block 740 to block 745) and the error protection level will be raised.

Turning now to FIG. 8, one implementation of a method 800 for adjusting cache line error protection levels is shown. A cache controller uses a first error protection level to protect a given cache line upon allocation in a cache (block 805). The first error protection level can be any of various levels, which vary from implementation to implementation. For example, different possible error protection levels include those using SEC-DED codes, DEC-TED codes, TEC-QED codes, and so on. The purpose of protecting the given cache line with the first error protection level is to detect and correct for any bit errors in the given cache line, to prevent erroneous data and/or instructions from being sent to a host processor.

Next, the cache controller detects first and second reads to the given cache line, wherein data of the given cache line is inverted in and stored back to the same data array entry in between the first and second reads (block 810). It is noted that the first and second reads refer to read accesses (i.e., load operations) that are initiated by an actual runtime application running on the host processor. This is in contrast to memory built-in self-test (MBIST) schemes which are offline cache testing schemes that run when the cache is not being used by a real application. Also, error correction data is updated for the inverted data of the given cache line after the first read (block 815).

If the total, estimated fault population of the given cache line changes between the first and second reads by an actual runtime application (conditional block 820, "yes" leg), then the cache controller switches to using a second error protection level for the given cache line, where the second error protection level is different from the first error protection level (block 820). Otherwise, if the total, estimated fault population of the given cache line remains the same between the first and second reads (no faults were detected during the second read) by the actual runtime application (conditional block 815, "yes" leg), then the cache controller continues to use the first error protection level for the given cache line (block 825). After blocks 815 and 825, method 800 ends. In one implementation, the term "fault population" is defined as a number of bit errors. In another implementation, the term "fault population" is defined as a number of bit errors and locations of the bit errors.

It is noted that method 800 (and the other methods described herein) can be used in combination with MBIST techniques or in place of MBIST techniques. For example, a computing system or device can omit MBIST circuitry and achieve area savings by using method 800 (for other methods). Alternatively, method 800 can be used to augment the MBIST techniques. For example, in one implementation, a server includes MBIST circuitry which checks for cache line bit faults on boot-up. However, this server can run for a long period of time without rebooting, and aging-related errors (or other types of errors) can occur in the caches after the initial boot. In this implementation, the server can implement method 800 (or another method described herein) to detect and mitigate for these types of cache bit errors.

Referring now to FIG. 9, one implementation of a method 900 for tracking faults in cache lines is shown. A cache controller records a first number of bit errors and first locations of bit errors following a first read of a cache line (block 905). It is assumed for the purposes of this discussion that an error correction scheme is used which is capable of detecting the locations of bit errors within a cache line. It is also assumed for the purposes of this discussion that the number of bit errors is low enough to allow for the locations of the bit errors to be determined. For example, the first locations of bit errors in the cache line could be the $3^{rd}$ bit position and the $11^{th}$ bit position in one implementation. When the locations of the bit positions with errors are detected, these locations are encoded and stored by the cache controller. It is noted that a shared storage area can be used for recording the first number of bits errors and first locations of bit errors in one implementation. In other words, the cache controller does not need to include storage for recording the bit error locations for all cache lines in the cache, but rather, the cache controller can maintain a relatively small storage area for storing the bit error data for a limited number of cache lines. When the fault population data for a given cache line is no longer needed, the memory locations can be reused for fault population data associated with another cache line.

Following a first read of a cache line, the cache controller inverts data of the cache line and regenerates error correction data for the inverted data (block 910). Next, the cache controller writes back the inverted data and regenerated error correction data over the original data and original error correction data, respectively, of the cache line (block 915). Then, the cache controller records a second number of bit errors and second locations of bit errors following a second read of the cache line (block 920). If the second locations of bit errors do not match the first locations of bit errors (conditional block 925, "no" leg), then the cache controller calculates and stores a total number of faults based on a number of mismatches between the first and second locations of bit errors (block 930).

For example, if there was a single bit error after the first read in the $4^{th}$ bit location, and there was a single bit error after the second read in the $9^{th}$ bit location, this indicates that there are two faults. In this case, the number of faults is equal to the sum of the numbers of errors for the first and second reads. If the cache controller only looked at the total number of bit errors after the first or after the second read (1 in both cases) and saw that the number of bit errors stayed the same after the first and second reads, the cache controller could calculate an incorrect value for the number of faults. Some masked faults can be detected only if a 0 is stored in a bit location while other masked faults can only be detected if a 1 is stored in a bit location. The cache controller is able to uncover the locations of these masked faults by tracking the changes in locations of errors after the data values are inverted. In another example, if there was a single bit error after the first read in the $5^{th}$ bit location, and there was a single bit error after the second read in the $5^{th}$ bit location, then this indicates that there is only one fault that is not masked. In this case, the total number of faults is equal to the unique numbers of errors for the first and second reads.

After block 930, the cache controller selects an error protection level for the cache line based on the total number of faults (block 935). Generally speaking, the cache controller increases the error protection level as the total number of faults increases. Or put another way, the cache controller decreases the error protection level for a cache line as the total number of faults in the cache line decreases. In some cases, if the total number of faults is greater than a threshold, then the cache controller disables the cache line from further use. After block 935, method 900 ends. Otherwise, if the second locations of bit errors match the first locations of bit errors (conditional block 925, "yes" leg), then the cache controller calculates the total number of faults in the traditional manner (block 940). After block 940, method 900 ends.

Figure 10:
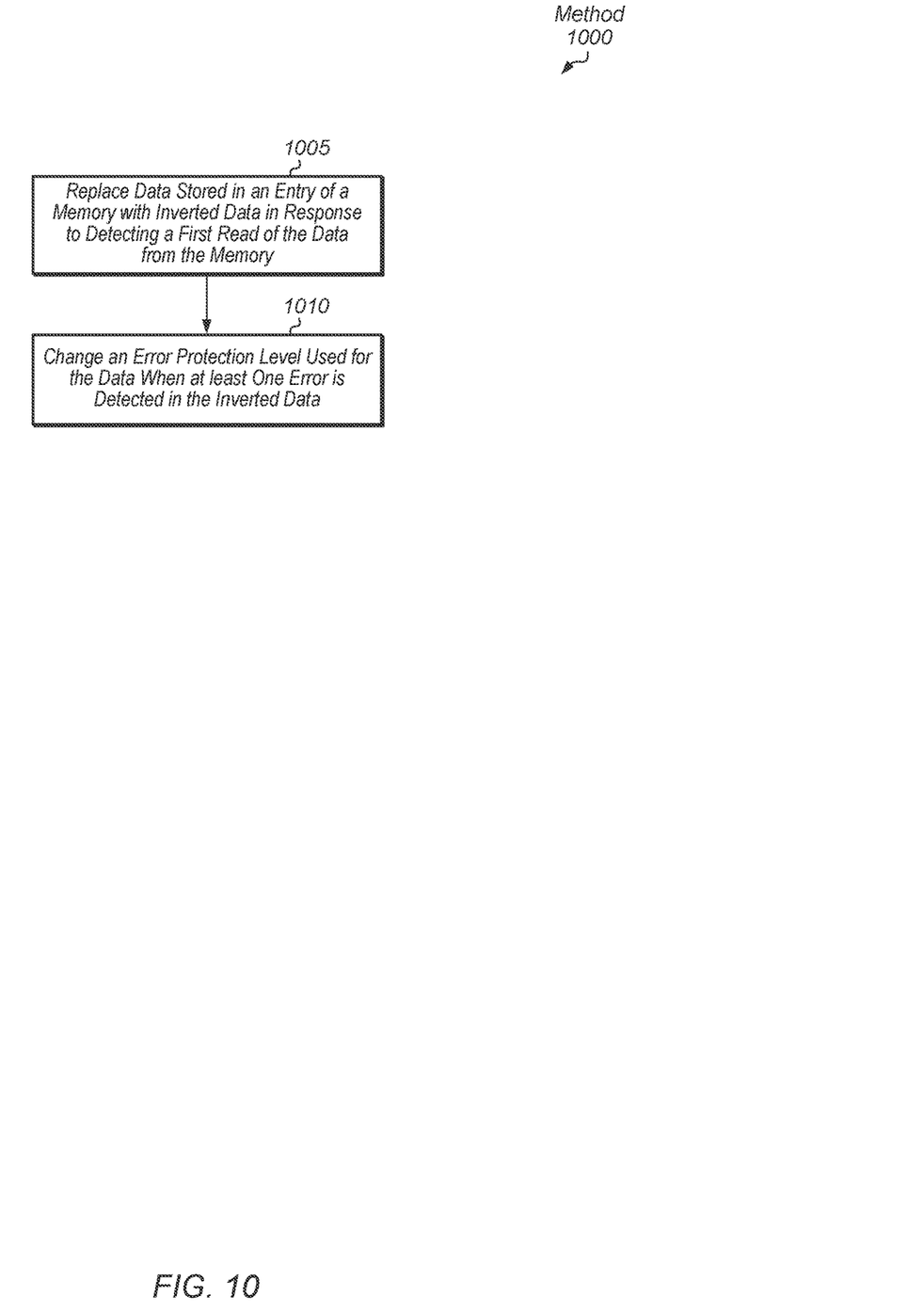
FIG. 10 is a generalized flow diagram illustrating one implementation of a method for updating error protection levels for data stored in a cache.

Turning now to FIG. 10, one implementation of a method 1000 for updating error protection levels for data stored in a cache is shown. A cache controller replaces data stored in an entry of a memory with inverted data in response to detecting a first read of the data from the memory (block 1005). Next, the cache controller changes an error protection level used for the data when at least one error is detected in the inverted data (block 1010). For example, in one implementation, the cache controller increases the error protection level after the second read of the data if the number of errors detected in the inverted data is non-zero. To increase the error protection level means that to increase the capability for detecting and correcting errors. For example, if an original error protection level was able to correct for one error, an example of an increased protection level is one that is able to correct for multiple errors. Typically, increasing the error protection level involves increasing the number of checkbits that are generated and stored for the data. It is noted that the data can be stored in an inverted or a non-inverted state after the error protection level is changed. After block 1010, method 1000 ends.

In various implementations, program instructions of a software application are used to implement the methods and/or mechanisms described herein. For example, program instructions executable by a general or special purpose processor are contemplated. In various implementations, such program instructions can be represented by a high level programming language. In other implementations, the program instructions can be compiled from a high level programming language to a binary, intermediate, or other form. Alternatively, program instructions can be written that describe the behavior or design of hardware. Such program instructions can be represented by a high-level programming language, such as C. Alternatively, a hardware design language (HDL) such as Verilog can be used. In various implementations, the program instructions are stored on any of a variety of non-transitory computer readable storage mediums. The storage medium is accessible by a computing system during use to provide the program instructions to the computing system for program execution. Generally speaking, such a computing system includes at least one or more memories and one or more processors configured to execute program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A cache comprising:
a cache controller configured to:
replace data stored in an entry of a memory with inverted data, responsive to detecting a read of the data from the memory; and
change an error protection level used for the inverted data when an error is detected in the inverted data after a read of the inverted data.

2. The cache as recited in claim 1, wherein the read of the inverted data is initiated by an application executing on a processor.

3. The cache as recited in claim 1, wherein the cache controller is further configured to:
record an indication of a first number of bit errors for the data after the read of the data;
determine a second number of bit errors for the inverted data responsive to performing the read of the inverted data, wherein the second number of bit errors is determined based on regenerated error correction bits corresponding to the inverted data; and
if the second number of bit errors is non-zero, increase the error protection level used for protecting the inverted data.

4. The cache as recited in claim 3, wherein the cache controller is configured to detect one or more masked faults in response to the read of the inverted data.

5. The cache as recited in claim 4, wherein a number of masked faults detected is equal to the second number of bit errors.

6. The cache as recited in claim 1, wherein the entry is a first cache line, and wherein the cache controller is configured to store an indication of a change in the error protection level for the first cache line.

7. The cache as recited in claim 6, wherein the cache controller is further configured to tag the first cache line as storing data in an inverted state following the read of the data from the memory.

8. A method comprising:
replacing, by a cache controller, data stored in an entry of a memory with inverted data, responsive to detecting a read of the data from the memory; and
changing an error protection level used for the inverted data when an error is detected in the inverted data after a read of the inverted data.

9. The method as recited in claim 8, wherein the read of the inverted data is initiated by an application executing on a processor.

10. The method as recited in claim 8, further comprising:
recording an indication of a first number of bit errors for the data after the read of the data;
determining a second number of bit errors for the inverted data responsive to performing the read of the inverted data, wherein the second number of bit errors is determined based on regenerated error correction bits corresponding to the inverted data;
if the second number of bit errors is non-zero, increasing the error protection level used for protecting the inverted data.

11. The method as recited in claim 10, further comprising detecting one or more masked faults in response to the read of the inverted data.

12. The method as recited in claim 11, wherein a number of masked faults detected is equal to the second number of bit errors.

13. The method as recited in claim 8, wherein the entry is a first cache line, and wherein the method further comprising storing an indication of a change in the error protection level for the first cache line.

14. The method as recited in claim 13, further comprising tagging the first cache line as storing data in an inverted state following the read of the data from the memory.

15. A system comprising:
a processor; and
a cache configured to:
   replace data stored in an entry of a memory with inverted data, responsive to detecting a read of the data from the memory by an application executing on the processor; and
   change an error protection level used for the inverted data when an error is detected in the inverted data after a read of the inverted data.

16. The system as recited in claim 15, wherein the error protection level is changed in response to the read of the inverted data initiated by the application.

17. The system as recited in claim 15, wherein the cache is further configured to:
   record an indication of a first number of bit errors for the data after the first read of the data;
   determine a second number of bit errors for the inverted data responsive to performing a read of the inverted data, wherein the second number of bit errors is determined based on regenerated error correction bits corresponding to the inverted data;
   if the second number of bit errors is non-zero, increase the error protection level used for protecting the inverted data.

18. The system as recited in claim 17, wherein one or more masked faults are detected responsive to the read of the inverted data.

19. The system as recited in claim 18, wherein a number of masked faults detected is equal to the second number of bit errors.

20. The system as recited in claim 15, wherein the entry is a first cache line, and wherein the cache is configured to store an indication of a change in the error protection level for the first cache line.

* * * * *